(12) United States Patent
Osanai

(10) Patent No.: US 7,749,880 B2
(45) Date of Patent: Jul. 6, 2010

(54) METHOD OF MANUFACTURING SEMICONDUCTOR INTEGRATED CIRCUIT DEVICE

(75) Inventor: Jun Osanai, Chiba (JP)

(73) Assignee: Seiko Instruments Inc. (JP)

( * ) Notice: Subject to any disclaimer, the term of this patent is extended or adjusted under 35 U.S.C. 154(b) by 317 days.

(21) Appl. No.: 11/196,095

(22) Filed: Aug. 3, 2005

(65) Prior Publication Data
US 2006/0079043 A1   Apr. 13, 2006

(30) Foreign Application Priority Data
Aug. 10, 2004   (JP)   ............... 2004-233807

(51) Int. Cl.
*H01L 21/336*   (2006.01)
*H01L 27/088*   (2006.01)

(52) U.S. Cl. ............... 438/595; 257/402; 257/E21.625; 257/E21.639

(58) Field of Classification Search ................ 438/149, 438/197, 151, 303, 595, 167, 179, 186, 199, 438/211, 216, 230, 286, 287; 257/262, 288, 257/391, 392, 402, 410–411, 487, 640, 649, 257/E21.625, 21.639, E29.263
See application file for complete search history.

(56) References Cited

U.S. PATENT DOCUMENTS

| | | | | |
|---|---|---|---|---|
| 4,368,085 A | * | 1/1983 | Peel | 148/33.3 |
| 4,814,854 A | * | 3/1989 | Tigelaar et al. | 257/382 |
| 5,051,794 A | * | 9/1991 | Mori | 257/316 |
| 5,716,875 A | * | 2/1998 | Jones et al. | 438/3 |
| 5,783,475 A | * | 7/1998 | Ramaswami | 438/303 |
| 5,936,279 A | * | 8/1999 | Chuang | 257/346 |
| 5,981,332 A | * | 11/1999 | Mandelman et al. | 438/246 |
| 6,214,673 B1 | * | 4/2001 | Grebs et al. | 438/274 |
| 6,239,014 B1 | * | 5/2001 | Liaw | 438/616 |
| 6,399,512 B1 | * | 6/2002 | Blosse et al. | 438/723 |
| 6,531,350 B2 | * | 3/2003 | Satoh et al. | 438/197 |
| 6,656,853 B2 | * | 12/2003 | Ito | 438/778 |
| 6,682,994 B2 | * | 1/2004 | Johnson et al. | 438/585 |
| 6,696,340 B2 | * | 2/2004 | Furuhata | 438/257 |
| 7,226,838 B2 | * | 6/2007 | Kim | 438/257 |
| 7,227,231 B2 | * | 6/2007 | Osanai | 257/369 |
| 7,352,046 B2 | * | 4/2008 | Osanai | 257/492 |
| 2002/0000605 A1 | * | 1/2002 | Liu et al. | 257/316 |
| 2002/0009866 A1 | * | 1/2002 | Jang et al. | 438/586 |

(Continued)

FOREIGN PATENT DOCUMENTS

JP   01106470 A   *   4/1989

(Continued)

*Primary Examiner*—W. David Coleman
*Assistant Examiner*—Maliheh Malek
(74) *Attorney, Agent, or Firm*—Adams & Wilks

(57) ABSTRACT

In a method of manufacturing a semiconductor integrated circuit device, a gate electrode is formed over a semiconductor substrate. An insulating film is then formed on the gate electrode and on regions corresponding to a source and a drain of the semiconductor integrated circuit device. The source and the drain are then formed. A nitride film is then selectively formed over the source and the gate electrode via the insulating film so that the nitride film extends over the gate electrode to a position short of a center of the gate electrode in a length direction thereof and so that a width of the nitride film is shorter than a channel width of the semiconductor integrated circuit device.

18 Claims, 5 Drawing Sheets

U.S. PATENT DOCUMENTS

| | | | |
|---|---|---|---|
| 2002/0037615 A1* | 3/2002 | Matsuo | 438/241 |
| 2004/0219751 A1* | 11/2004 | Satoh et al. | 438/267 |
| 2005/0190628 A1* | 9/2005 | Osanai | 365/226 |
| 2006/0014389 A1* | 1/2006 | Osanai | 438/684 |
| 2006/0033159 A1* | 2/2006 | Osanai | 257/345 |
| 2006/0267106 A1* | 11/2006 | Chao et al. | 257/382 |
| 2009/0263972 A1* | 10/2009 | Balseanu et al. | 438/696 |

FOREIGN PATENT DOCUMENTS

| | | | |
|---|---|---|---|
| JP | 03198348 A | * | 8/1991 |
| JP | 05183156 A | * | 7/1993 |

* cited by examiner

METHOD OF MANUFACTURING SEMICONDUCTOR INTEGRATED CIRCUIT DEVICE

BACKGROUND OF THE INVENTION

1. Field of the Invention

The present invention relates to an analog semiconductor integrated circuit device having a sensor or a power management function, and to a method of manufacturing the semiconductor integrated circuit device.

2. Description of the Related Art

When an analog semiconductor integrated circuit device having a sensor or a power management function is composed of MOS transistors, a so called multi-Vth method, in which a plurality of threshold voltages (hereinafter, referred to as Vth) of the MOS transistor, instead of one, are used, is generally applied in order to carry out complicated analog signal processing and to cover various input voltage ranges.

In a conventional semiconductor integrated circuit device as shown in FIGS. 7A and 7B, Vth value of a MOS transistor is determined by ion implantations 203 and 205. A plurality of photolithography steps and a plurality of ion implanting steps are performed to form a multi-Vth device (For example, refer to JP 2000-323587 A (p. 6, FIG. 2)).

In the prior art, a plurality of photolithography steps and a plurality of ion implanting steps to attain a multi-Vth device have increased the cost for manufacturing and have elongated a manufacturing period, which turns to be a problem in product delivery. Further, since the number of steps cannot be increased unnecessarily, it is essentially impossible to attain multi-Vth having too many threshold voltages.

SUMMARY OF THE INVENTION

The present invention has an object to provide a method of manufacturing a semiconductor integrated circuit device in which fine Vth control is realized by adding a few steps.

In order to solve the above problems, the present invention employs the following means.

(1) A method of manufacturing a MOS transistor, including the steps of: forming a gate electrode; forming an insulating film on the gate electrode and on regions to be a source and a drain respectively; forming the source and the drain; and selectively forming a nitride film on the insulating film.

(2) A method of manufacturing a semiconductor integrated circuit device, in which the nitride film is formed by low-pressure chemical vapor deposition (CVD) and has a thickness of 50 nm or more.

According to the present invention, only adding one step can attain sufficiently many Vth's, and the product delivery can be shortened at the same level as in the case of the product that uses a non-multi-Vth method. The detailed mechanism will be described later.

DETAILED DESCRIPTION OF THE PREFERRED EMBODIMENTS

Description will be made of an embodiment of the present invention with reference to the drawings.

Embodiment 1

Figure 1:
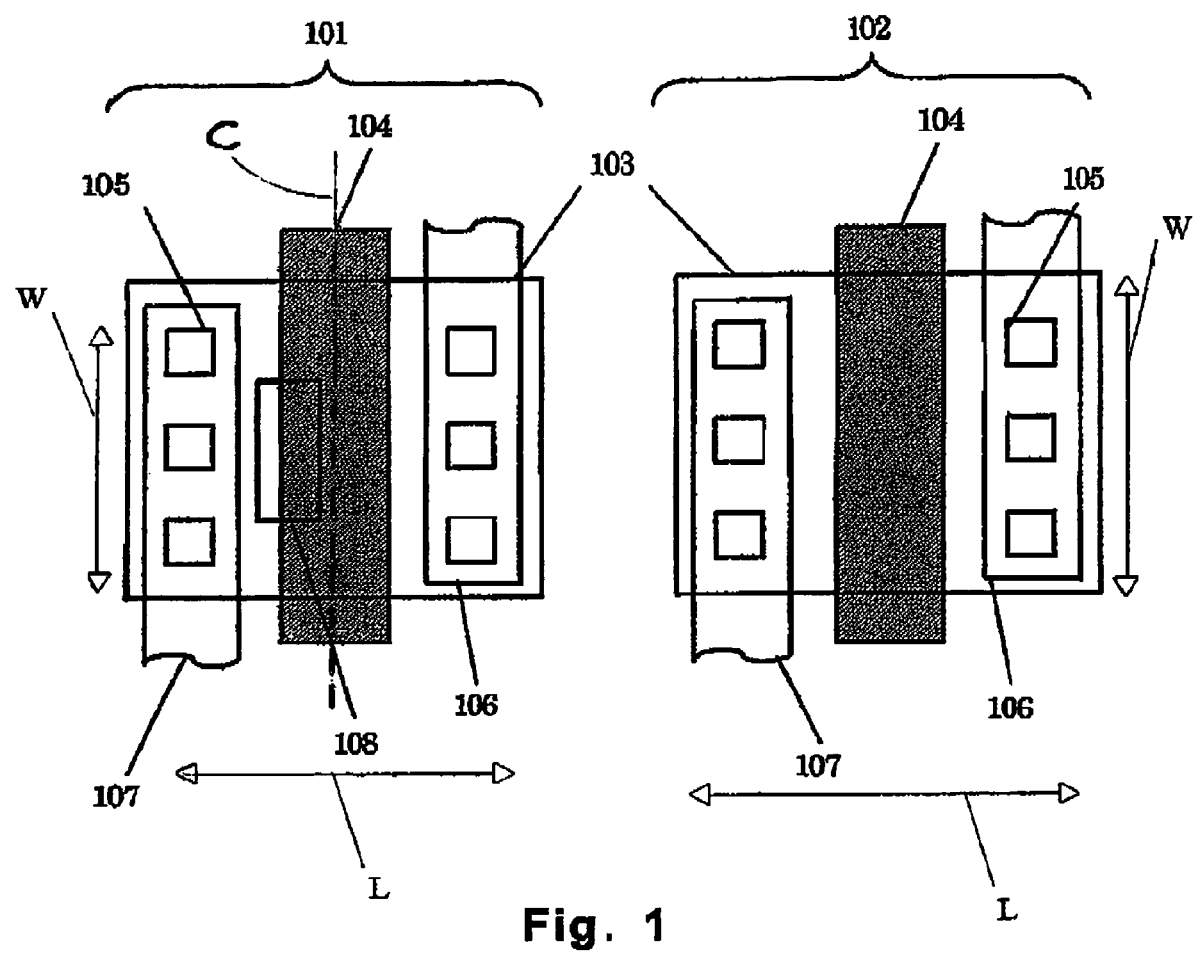
FIG. 1 is a schematic plan view showing Embodiment 1 of the present invention.

FIG. 1 is a schematic plan view showing Embodiment 1 of the present invention. FIG. 1 shows the first MOS transistors 101, which includes: an active region 103 that defines a region of the MOS transistor; a gate electrode 104 of the MOS transistor; a contact 105 that electrically connects a source or a drain of the MOS transistor with a wiring metal; and a source wiring metal 107 and a drain wiring metal 106. FIG. 1 also shows the second MOS transistor 102 including the same components as those of the first MOS transistor 101. In FIG. 1, a gate length direction or channel length direction is designated by arrow L and a gate width direction or channel width direction is designated by arrow W.

A difference between the first MOS transistor and the second MOS transistor is that the first MOS transistor has a nitride film 108 arranged to extend over the gate electrode and the source. A nitride film is generally not arranged as shown in the second MOS transistor. When a nitride film is arranged to overlap with both the gate electrode and the source, Vth increases in an NMOS while Vth decreases in a PMOS. That is, an absolute value of Vth increases in both cases. In a MOS transistor, an interface trap generally exists at the interface between the semiconductor substrate and the gate insulating film, and the interface trap has a high density in an overlap region of the gate electrode and the source or drain. In a sintering process in an atmosphere containing hydrogen that proceeds an alloying reaction between a wiring metal and a semiconductor or in the formation of a protection film containing hydrogen such as a plasma nitride film, hydrogen diffuses through the insulating film and reaches the interface between the semiconductor substrate and the gate insulating film to terminate the interface level to lower the trap density. When the nitride film 108 is formed by low-pressure CVD, when the nitride film is arranged to overlap with the gate electrode and the source, the nitride film suppresses hydrogen diffusion to prevent lowering of the interface level density, and Vth remains high in absolute value in the MOS having the above layout. The present invention utilizes this phenomenon. The first MOS transistor 101 shown in FIG. 1 has a higher Vth in absolute value than that of the second MOS transistor 102. Accordingly, sufficiently many Vth's can be realized in the same semiconductor integrated circuit by variably designing an overlap amount of the nitride film which overlaps with the gate electrode with respect to a channel width.

Figure 2:
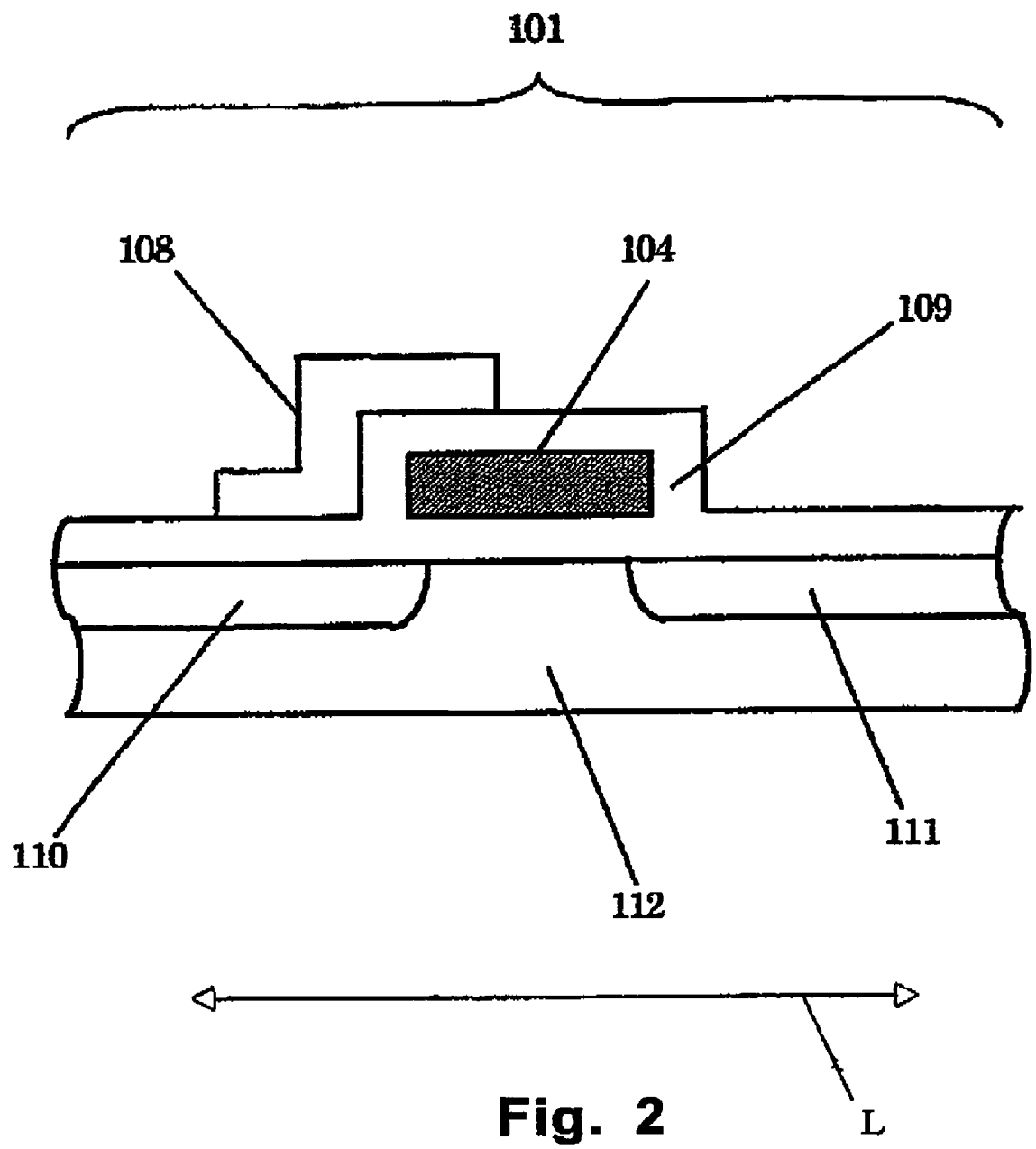
FIG. 2 is a schematic sectional view showing Embodiment 1 of the present invention.

FIG. 2 is a schematic sectional view of the first MOS transistor of the present invention. The nitride film 108 is arranged on both the gate electrode 104 and the source diffusion region 110 through the insulating film 109 formed by thermal oxidation or CVD. Such a sectional structure can prevent the interface trap having high density from being terminated by hydrogen in the overlap region of the gate electrode and the source.

The same effect as above can be obtained even when the nitride film is arranged to overlap with the drain and the gate electrode. Increase in Vth is, however, small, when the MOS transistor operates in a saturated, and it is more effective to arrange the nitride film to overlap with the source and the gate electrode. Considering an alignment error in a photo step, each overlap amount of the nitride film 108 to the gate electrode and the source needs to be 0.2 µm or more.

Next, description will be made of a method of manufacturing the structure of the present invention with reference to the drawings.

Figure 3:
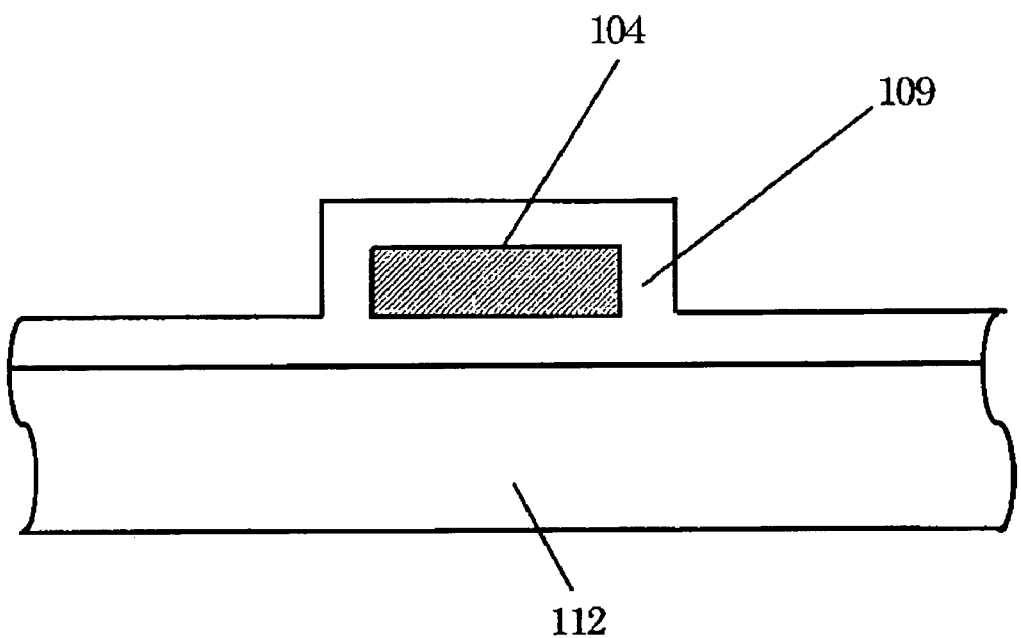
FIG. 3 is a schematic sectional view showing a method of manufacturing a semiconductor device in Embodiment 1 of the present invention.

FIG. 3 shows a step at which: a gate insulating film is formed on a semiconductor substrate 112; then, the gate electrode 104 is formed with photolithography and etching; and the insulating film 109 is formed with thermal oxidation or CVD. Polycrystalline silicon, to which an impurity is introduced, or a laminated film made of polycrystalline silicon and high-melting point metal silicide is used as a material for the gate electrode. The gate electrode generally has a thickness of approximately 300 nm. The insulating film 109 is formed in order to improve reliability of a semiconductor device. A thermal oxide film, which is formed through oxidation at about 900° C., or an oxide film formed by CVD is generally used as the insulating film. The insulating film has a thickness of approximately 30 nm, and is formed simultaneously on the respective regions to be the source and the drain later.

Figure 4:
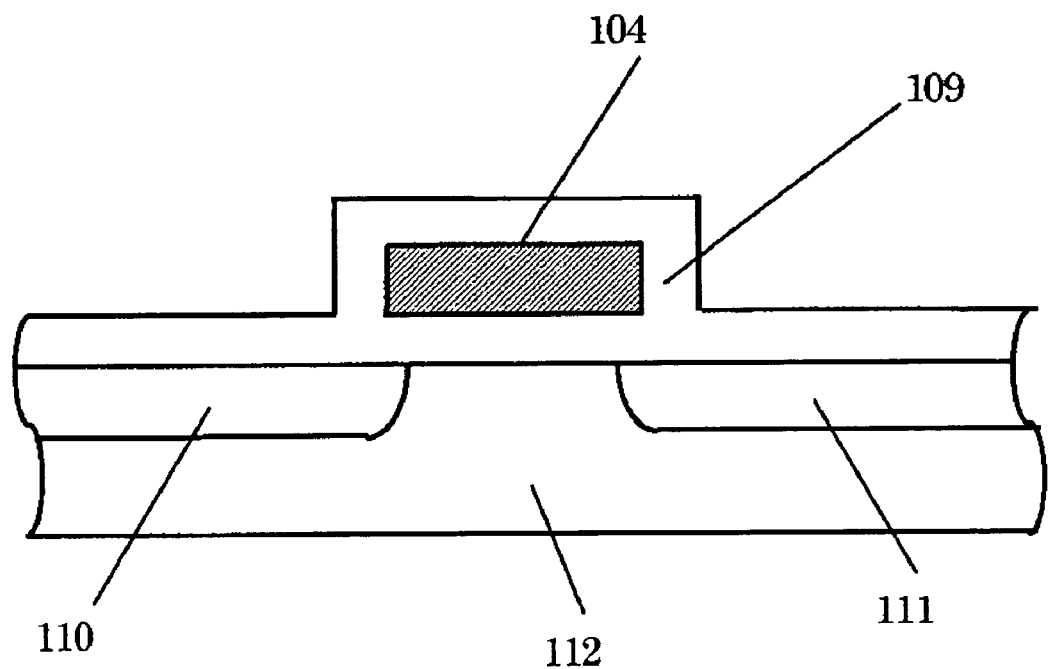
FIG. 4 is a schematic sectional view showing the method of manufacturing a semiconductor device in Embodiment 1 of the present invention.

Next, as shown in FIG. 4, the source diffusion region 110 and the drain diffusion region 111 each having a high concentration impurity are formed using photolithography and ion implantation techniques. The figure shows a single drain structure. Additionally, a low concentration diffusion region can be formed with the same method for attaining a higher withstanding voltage and higher reliability.

Figure 5:
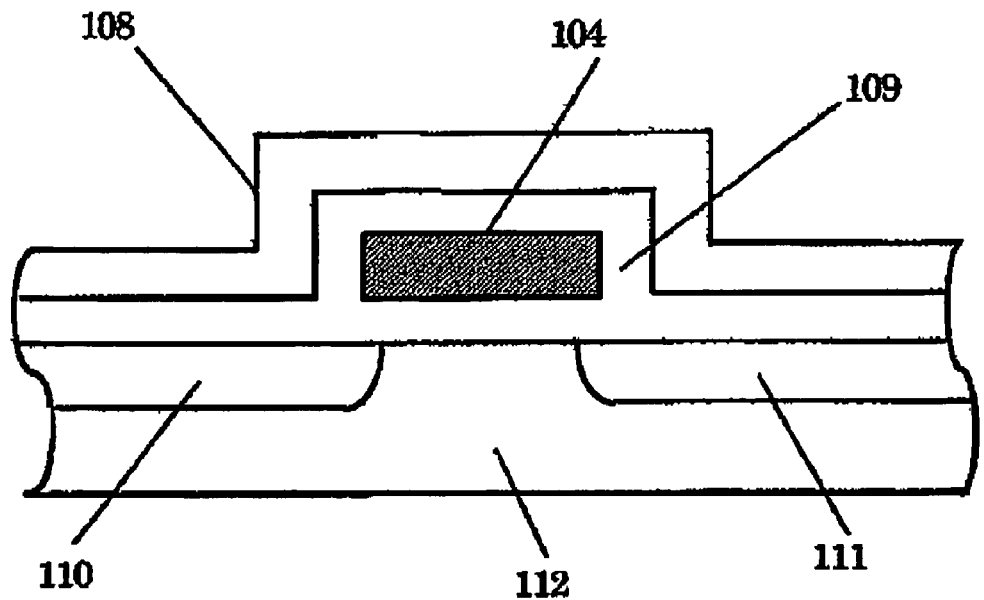
FIG. 5 is a schematic sectional view showing the method of manufacturing a semiconductor device in Embodiment 1 of the present invention.

SubsequentlY, as shown in FIG. 5, the nitride film 108 is formed on the semiconductor substrate by low-pressure CVD. A nitride film formed by low-pressure CVD is used since the nitride film formed by low-pressure CVD differs from a nitride film formed by plasma CVD in that a concentration of hydrogen contained in the film is low and a hydrogen diffusion stopping power is high. The thickness of the film needs to be 50 nm or more to prevent hydrogen diffusion in the film.

Figure 6:
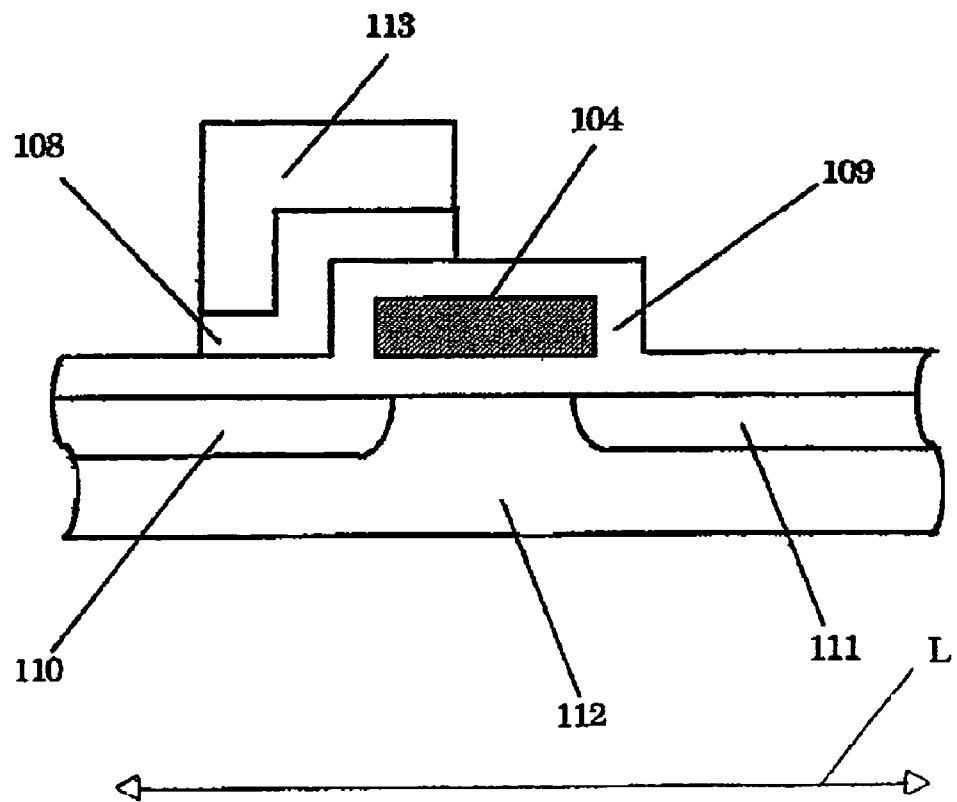
FIG. 6 is a schematic sectional view showing the method of manufacturing a semiconductor device in Embodiment 1 of the present invention.
Figure 7A:
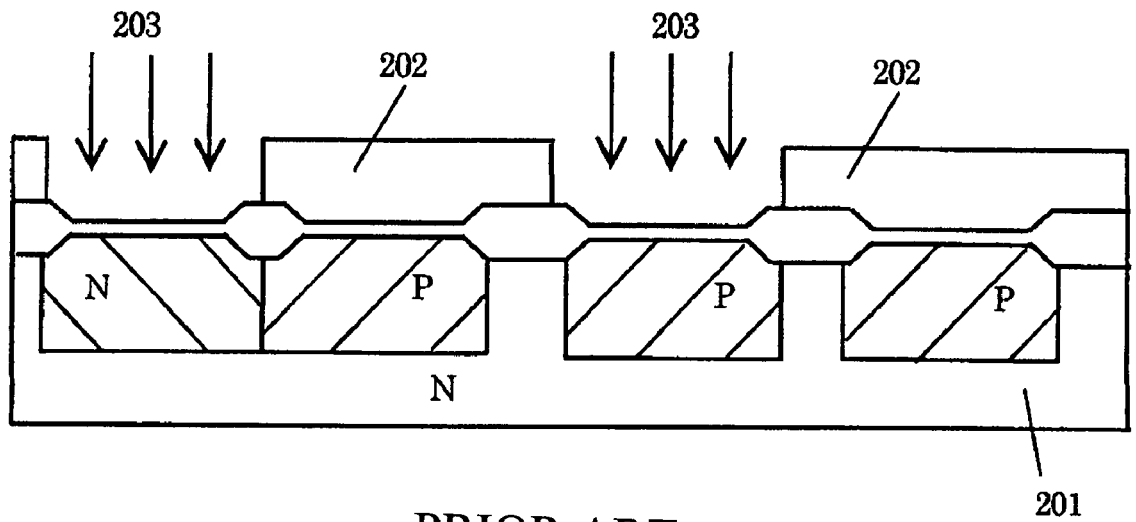
FIGS. 7A and 7B are schematic sectional views showing formation steps of a conventional device.
Figure 7B:
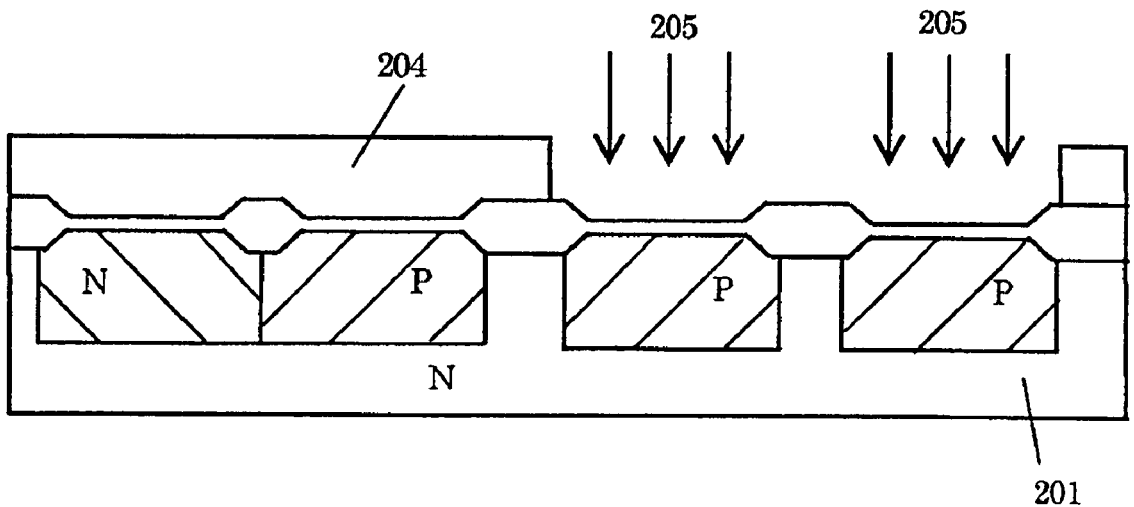

Next, as shown in FIG. 6, a photoresist 113 is disposed in a region which overlaps with the gate electrode 104 and the source 110 by photolithography, and a pattern of the nitride film 108 is formed by dry etching, so that the nitride film 108 extends over the source 110 and the gate electrode 104. More specifically, as best shown in FIGS. 1, 2 and 6, the nitride film 108 extends over the gate electrode 104 to a position short of a center of the gate electrode 104 in the gate length direction L, and a width of the nitride film is shorter than a channel width (i.e., the width of the channel in the gate width direction W) of the semiconductor integrated circuit device. When an oxide film is just beneath the nitride film, selectivity of the nitride film to the oxide film can be sufficiently secured in dry etching to obtain the structure shown in the figure.

The photoresist is then removed and formation of an intermediate insulating film, contact hole formation to obtain electrical connection between a wiring metal and an element, formation of the wiring metal, and formation of a final protective film are performed to complete the semiconductor integrated circuit device shown in FIGS. 1 and 2.

As described above, according to the manufacturing method of the present invention, a semiconductor device having sufficiently many Vth's can be realized without increase in cost and in manufacturing period, and an analog semiconductor integrated circuit device with high added value and high function can be provided.

What is claimed is:

1. A method of manufacturing a semiconductor integrated circuit device, comprising the steps of:
   forming a gate electrode;
   forming an insulating film on the gate electrode and on regions corresponding to a source and a drain of the semiconductor integrated circuit device;
   forming the source and the drain; and
   selectively forming a nitride film on the insulating film and over the source and the gate electrode so that the nitride film extends over the gate electrode to a position short of a center of the gate electrode in a length direction thereof and so that a width of the nitride film is shorter than a channel width of the semiconductor integrated circuit device.

2. A method of manufacturing a semiconductor integrated circuit device according to claim 1; wherein the step of forming the nitride film comprises the step of forming the nitride film by low-pressure CVD and with a thickness of 50 nm or more.

3. A method of manufacturing a semiconductor integrated circuit device according to claim 2; wherein the step of forming the insulating film comprises the step of forming the insulating film with a thickness of approximately 30 nm.

4. A method of manufacturing a semiconductor integrated circuit device according to claim 1; wherein the step of forming the insulating film comprises the step of forming the insulating film with a thickness of approximately 30 nm.

5. A method of manufacturing a semiconductor integrated circuit device according to claim 1; wherein the step of forming the nitride film comprises forming the nitride film by dry etching.

6. A method of manufacturing a semiconductor integrated circuit device according to claim 1; wherein the step of forming the gate electrode comprises forming the gate electrode with a thickness of approximately 300 nm.

7. A method of manufacturing a semiconductor integrated circuit device according to claim 1; wherein the step of forming the nitride film comprises forming the nitride film by low-pressure CVD.

8. A method of manufacturing a semiconductor integrated circuit device, comprising:
   forming a gate electrode on a semiconductor substrate;
   forming an insulating film on the gate electrode and over the semiconductor substrate;
   forming a source and a drain in the semiconductor substrate to define a channel disposed between the source and the drain and under the gate electrode; and
   forming a nitride film on the insulating film so that the nitride film extends over the source and the gate electrode to a position short of a center of the gate electrode in a length direction of the channel and so that a width of the nitride film is shorter than a width of the channel.

9. A method of manufacturing a semiconductor integrated circuit device according to claim 8; wherein the step of forming the nitride film comprises the step of forming the nitride film by low-pressure CVD and with a thickness of 50 nm or more.

10. A method of manufacturing a semiconductor integrated circuit device according to claim 9; wherein the step of forming the insulating film comprises the step of forming the insulating film with a thickness of approximately 30 nm.

11. A method of manufacturing a semiconductor integrated circuit device according to claim 8; wherein the step of forming the insulating film comprises the step of forming the insulating film with a thickness of approximately 30 nm.

12. A method of manufacturing a semiconductor integrated circuit device according to claim 8; wherein the step of forming the nitride film comprises forming the nitride film by dry etching.

13. A method of manufacturing a semiconductor integrated circuit device according to claim 8; wherein the step of forming the gate electrode comprises forming the gate electrode with a thickness of approximately 300 nm.

14. A method of manufacturing a semiconductor integrated circuit device according to claim 8; wherein the step of forming the nitride film comprises forming the nitride film by low-pressure CVD.

15. A method of manufacturing a semiconductor integrated circuit device according to claim 1; wherein the step of forming the insulating film comprises the step of forming a thermal oxide film through oxidation at about 900° C.

16. A method of manufacturing a semiconductor integrated circuit device according to claim 1; wherein the step of forming the nitride film comprises forming the nitride film over the source and the gate electrode so that an overlap amount of the nitride film relative to each of the source and the gate electrode is 2 μm or more.

17. A method of manufacturing a semiconductor integrated circuit device according to claim 8; wherein the step of forming the insulating film comprises the step of forming a thermal oxide film through oxidation at about 900° C.

18. A method of manufacturing a semiconductor integrated circuit device according to claim 8; wherein the step of forming the nitride film comprises forming the nitride film over the source and the gate electrode so that an overlap amount of the nitride film relative to each of the source and the gate electrode is 2 μm or more.

* * * * *